United States Patent
Lee

(10) Patent No.: US 7,569,919 B2
(45) Date of Patent: Aug. 4, 2009

(54) MULTI-CHIP PACKAGE FOR REDUCING TEST TIME

(75) Inventor: Sang-Ho Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 476 days.

(21) Appl. No.: 11/326,925

(22) Filed: Jan. 6, 2006

(65) Prior Publication Data

US 2006/0151866 A1 Jul. 13, 2006

(30) Foreign Application Priority Data

Jan. 7, 2005 (KR) .................. 10-2005-0001530

(51) Int. Cl.
 *H01L 23/02* (2006.01)
 *H01L 23/34* (2006.01)
(52) U.S. Cl. ...................... 257/678; 257/723
(58) Field of Classification Search ......... 257/678–681, 257/690, 723, 777–778, E23.085
See application file for complete search history.

(56) References Cited

U.S. PATENT DOCUMENTS

| 6,219,289 B1 | 4/2001 | Satoh et al. |
| 7,116,603 B2 * | 10/2006 | Kanda et al. ............. 365/225.7 |
| 2006/0083096 A1 * | 4/2006 | Yang ..................... 365/230.03 |

FOREIGN PATENT DOCUMENTS

| JP | 2003-270302 | 9/2003 |
| KR | 2003-0093243 | 12/2003 |

OTHER PUBLICATIONS

English language abstract of Korean Publication No. 2003-0093243.
English language abstract of Japanese Publication No. 2003-270302.

* cited by examiner

*Primary Examiner*—Cuong Q Nguyen
(74) *Attorney, Agent, or Firm*—Marger Johnson & McCollom, P.C.

(57) ABSTRACT

A multi-chip package is provided. The multi-chip package includes semiconductor chips. The multi-chip package receives selection signals for selecting two or more chips in response to the selection signals. Any number of chips may be simultaneously selected for a test and the test time can be reduced.

15 Claims, 4 Drawing Sheets

MULTI-CHIP PACKAGE FOR REDUCING TEST TIME

CROSS-REFERENCE TO RELATED PATENT APPLICATIONS

This application claims the benefit of Korean Patent Application No. 10-2005-0001530, filed on Jan. 7, 2005, in the Korean Intellectual Property Office, the disclosure of which is incorporated herein in its entirety by reference.

BACKGROUND OF THE INVENTION

1. Field of the Invention

This disclosure relates to semiconductor devices, and, more particularly, to a multi-chip package (MCP).

2. Description of the Related Art

A multi-chip package has semiconductor chips integrated into one package. Typically, after the chips are installed on a multi-chip package (MCP) board and packaged with it, their functions and electrical characteristics such as alternating current (AC) and direct current (DC) parameters are tested to examine whether or not they meet requirements determined during the design of the MCP.

Bare chips to be installed on the MCP board are tested, discarding defective chips. However, the chips may be damaged during an internal bonding process or a packaging process. Since the MCP test is performed in the after the chips are packaged, it is difficult to individually detect defects on each chip. Furthermore, when only one of the chips is defective, the entire MCP should be discarded. Therefore, in order to individually test the chips, an additional internal circuit is provided in each chip.

FIG. 1 illustrates a chip selection method in an MCP test. As shown in FIG. 1, when an MCP includes two semiconductor memory chips, a most significant bit (MSB) address pin A24 is commonly used to select a chip to be tested. A first chip Chip1 may be selected when a logic LOW signal is input to the MSB address pin A24, and a second chip Chip2 is selected when a logic HIGH signal is input to the MSB address pin A24.

According to this one chip selection method, only one chip is selected from several semiconductor chips for a test. Since the semiconductor chips are tested one by one, the test time is inevitably long.

SUMMARY OF THE INVENTION

Embodiments provide multi-chip packages capable of simultaneously selecting several chips to be tested.

Embodiments also provide multi-chip packages requiring reduced test times because the packages are capable of simultaneously testing several chips.

Embodiments provide multi-chip packages having several chips, which receive a selection signal for selecting one or more of the chips.

BRIEF DESCRIPTION OF THE DRAWINGS

The above and other features and advantages of the invention will become more apparent by describing embodiments in detail with reference to the attached drawings, in which.

DETAILED DESCRIPTION OF THE INVENTION

Hereinafter, embodiments will be described in detail with reference to the accompanying drawings.

Figure 1:
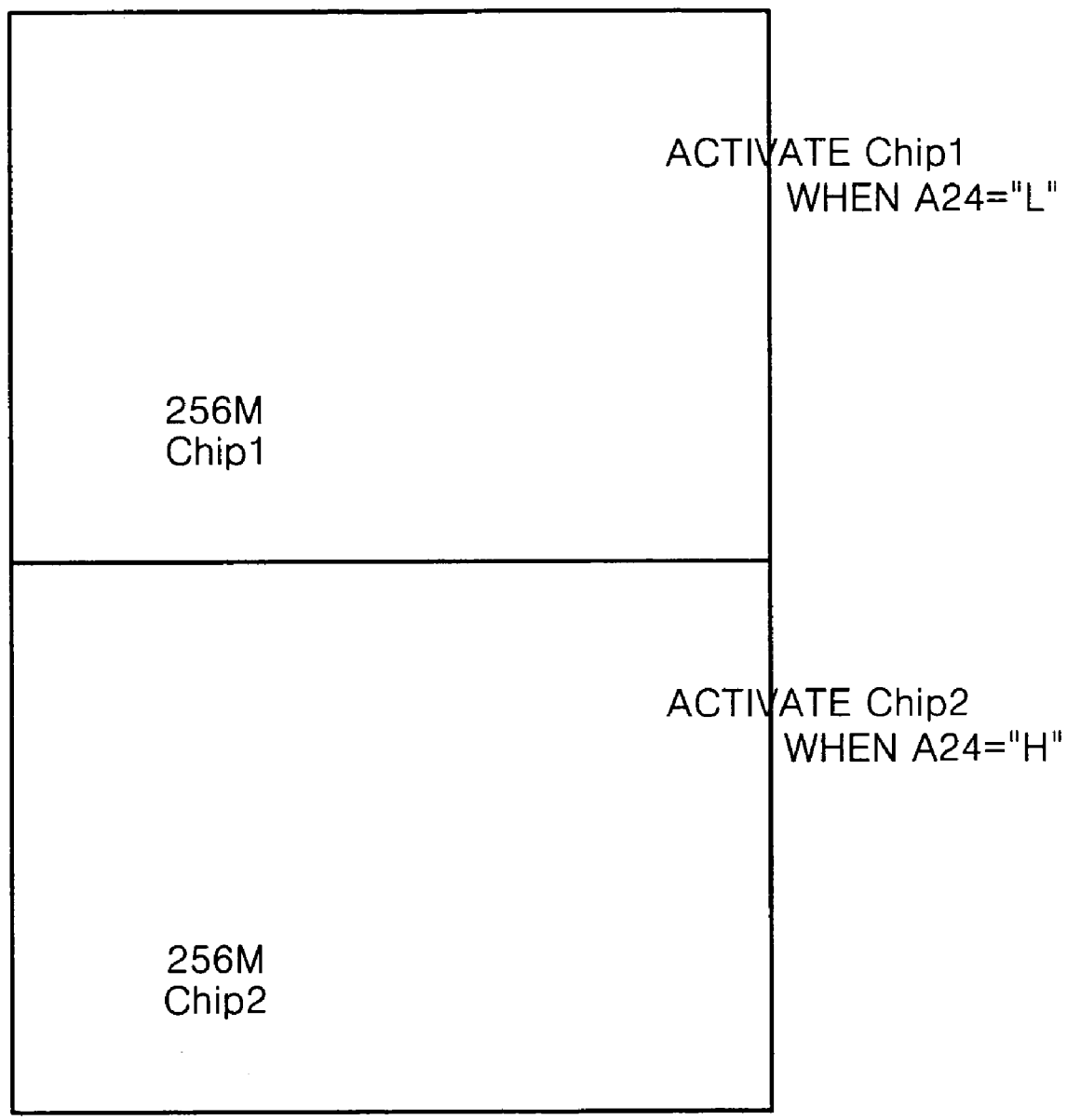
FIG. 1 shows a chip selection method in an MCP test.
Figure 2:
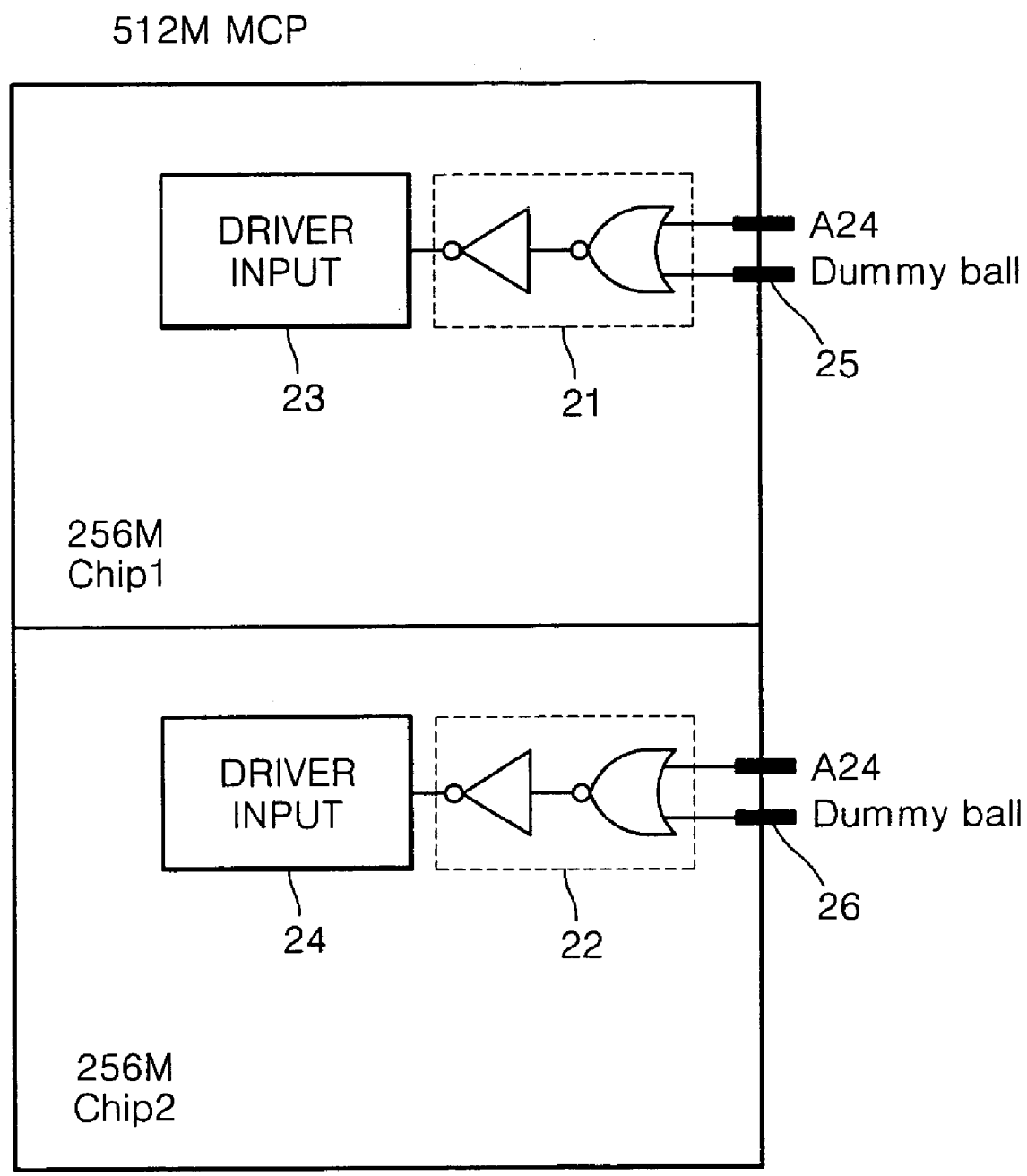
FIG. 2 shows a chip selection method in an MCP test according to an embodiment of the invention.

FIG. 2 shows a chip selection method in an MCP test according to an embodiment of the invention. In the chip selection method illustrated in FIG. 2, several chips may be simultaneously enabled by combining a signal input to the MSB address pin A24 and a signal input to a dummy ball that is used during testing. The dummy ball may be a terminal that is only used during testing.

For example, in one embodiment, assuming that the MCP is a 512 Mbyte semiconductor consisting of a first chip Chip1 having a capacity of 256 Mbytes and a second chip Chip2 having a capacity of 256 Mbytes, the first chip Chip1 is selected in response to a logic LOW signal on a driver input 23, and the second chip Chip2 is selected in response to a logic HIGH signal on a driver input 24, one or two chips can be enabled in response to the signal input to the MSB address pin A24 and the signal input to the dummy ball. In this case, the MSB address pin A24 is a common connection of the first and the second chips, Chip1 and Chip2. However, each chip has its own separate dummy ball.

Chips Chip1 and Chip2 have OR gates 21 and 22 for performing an OR operation on the signal input from the MSB address pin A24 and the signal input from the respective dummy ball 25 or 26, and driver input units 23 and 24 for receiving a chip selection signal output from the OR gates 21 and 22 to select the first and second chips Chip1 and Chip2, respectively.

For example, when only the first chip Chip1 should be tested, a logic LOW signal is input to the MSB address pin A24. If the signals input to the dummy ball 25 and the dummy ball 26 are logic LOW signals, both the chip selection signals input to the drive input unit 23 and 24 are at a logic LOW level. Therefore, because the first chip Chip1 is selected in response to a logic LOW and the second chip Chip2 is selected in response to a logic HIGH, only the first chip Chip1 is enabled.

When only the second chip Chip2 should be tested, a logic HIGH level signal is input to the MSB address pin A24 and the dummy balls 25 and 26 of the first and the second chips, Chips1 and Chip2 respectively. Then, both the chip selection signals input to the driver input units 23 and 24 are at a logic HIGH level, and thus, only the second chip Chip2 is enabled.

When both the first and the second chips Chip1 and Chip2 should be simultaneously tested, the logic LOW level signal is input to the MSB address pin A24, the logic LOW level signal is input to the dummy ball 25 of the first chip Chip1, and the logic HIGH level signal is input to the dummy ball 26 of the second chip Chip2. As a result, the logic LOW level chip selection signal is input to the driver input unit 23 of the first chip Chip1, and the logic HIGH level chip selection signal is input to the driver input unit 24 of the second chip Chip2. As a result, both the first and the second chips Chip1 and Chip2 are enabled.

Therefore, it is possible to simultaneously test several chips by using the dummy balls of the chips used during testing, and reduce the chip test time of a multi-chip package by half.

Figure 3:
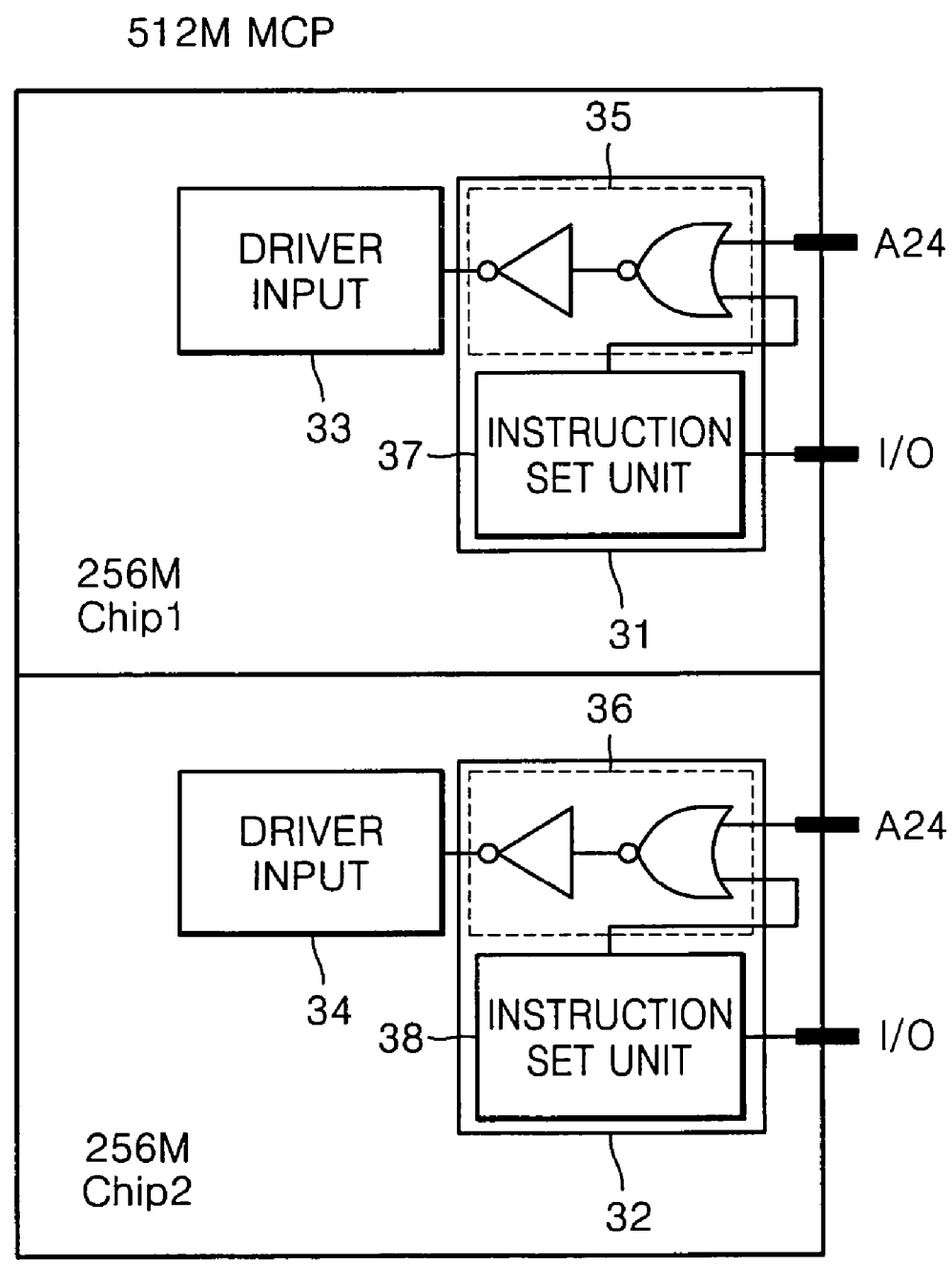
FIG. 3 shows a chip selection method in an MCP test according to another embodiment of the invention.

FIG. 3 shows a chip selection method in an MCP test according to another embodiment of the invention. In the chip selection method illustrated in FIG. 3, several chips may be simultaneously enabled by using an instruction set used for testing that is among the instruction sets input through an I/O pin other than the MSB address pin A24.

Referring to FIG. 3, an MCP according to another embodiment of the invention includes a first chip Chip1 and a second chip Chip2. Each of the chips Chip1 and Chip2 has a chip selection unit, 31 and 32, and a driver input unit, 33 and 34 respectively. The chip selection units 31 and 32 include OR operation units 35 and 36 and instruction set units 37 and 38 respectively. The MSB address input pin A24 and the I/O pin shown in FIG. 3 are commonly used by the first and second chips Chip1 and Chip2.

Predetermined instruction sets are used by the instruction set unit 37 and 38 to output signals used in enabling chips Chip1 and Chip2. For example, when the first chip Chip1 and the second chip Chip2 should be simultaneously selected for the MCP test, a logic LOW level signal is input to the MSB address pin A24, and a predetermined instruction set for enabling both chips Chip1 and Chip2 is input to the I/O pin. In response the instruction set unit 37 of the first chip Chip1 outputs a logic LOW level signal, and the instruction set unit 38 of the second chip Chip2 outputs a logic HIGH level signal. Then, the chip selection unit 31 of the first chip Chip1 outputs a logic LOW level signal, and the chip selection unit 32 of the second chip Chip2 outputs a logic HIGH level signal. Therefore, because the chips Chip1 and Chip2 are selected with a logic LOW and a logic HIGH level signal respectively, both the first chip Chip1 and the second chip Chip2 are simultaneously selected for the MCP test.

In another embodiment the predetermined instruction set may be used to select chips to be tested without using the MSB address pin A24.

When using an instruction set unit in the selection of chips, the MCP test may be performed in such a way that only the first chip Chip1 is selected when a first predetermined instruction set is input, only the second chip Chip2 is selected when a second predetermined instruction set is input, and both the first and the second chips Chip1 and Chip2 are simultaneously selected when a third predetermined instruction set is input. By using instructions set units to select chips, any number of chips may be selected in any combination by predetermined instructions sets designed to select the combinations.

Figure 4:
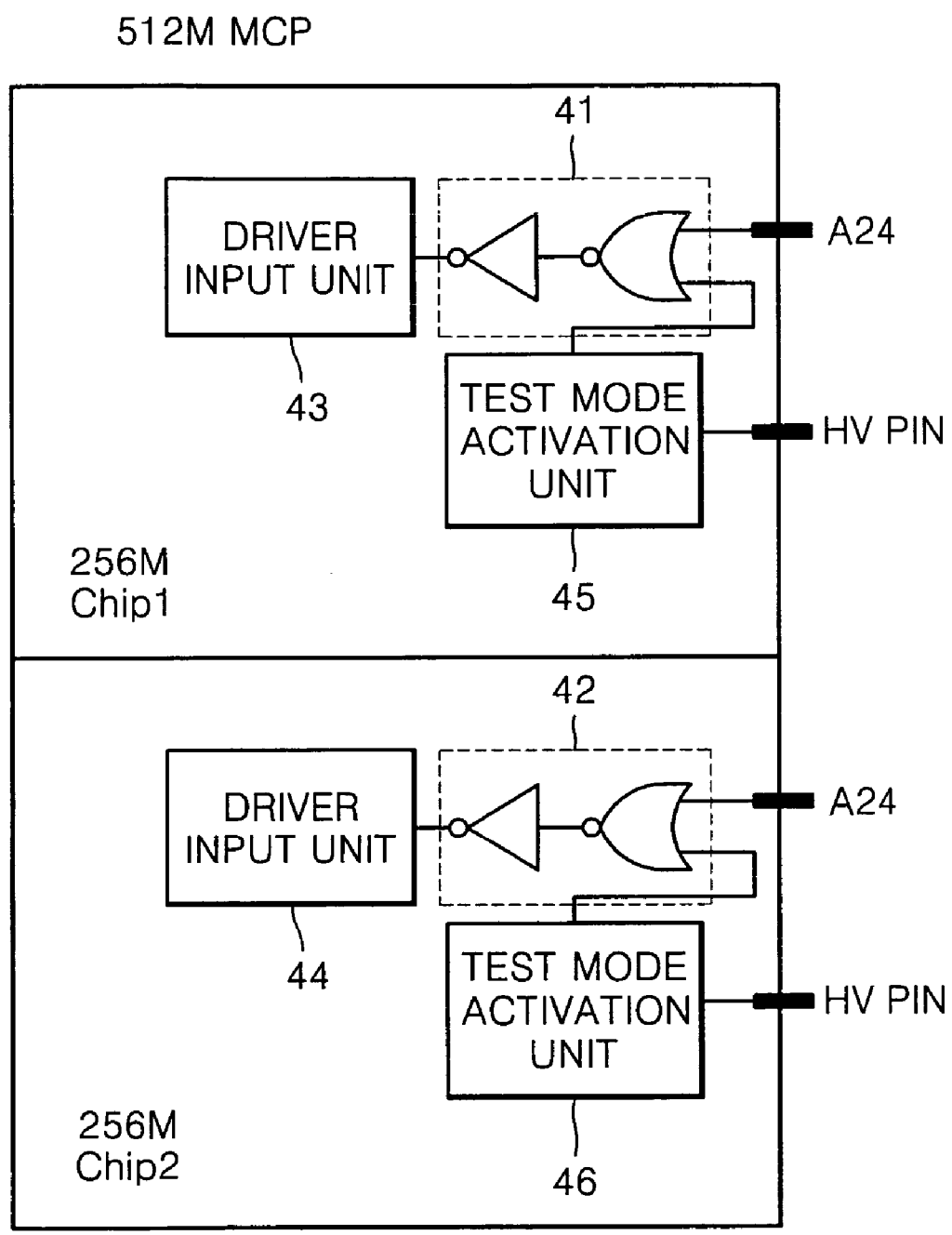
FIG. 4 shows a chip selection method in an MCP test according to still another embodiment of the invention.

FIG. 4 shows a chip selection method in an MCP test according to another embodiment. Several chips may be simultaneously enabled by combining a signal input to the MSB address pin A24 with a high voltage signal input to a high voltage input pin HV used during testing.

For example, assume that the MCP is a 512 Mbyte semiconductor including a first chip Chip1 having a capacity of 256 Mbytes and a second chip Chip2 having a capacity of 256 Mbytes. The first chip Chip1 is selected in response to a logic LOW on a drive input 43 signal, and the second chip Chip2 is selected in response to a logic HIGH signal on a drive input unit 44. In this example, both the MSB address pin A24 and the high voltage input pin HV are commonly used by the first and the second chips Chip1 and Chip2.

The first chip Chip1 includes a test mode activation unit 45 for outputting a logic LOW signal in response to the high voltage signal input through the high voltage input pin HV, an OR gate 41 for performing an OR operation on the signal input from the MSB address pin A24 and the signal output from the test mode activation unit 45, and a driver input unit 43 for receiving a chip selection signal output from the OR gate 41. The second chip Chip2 includes a test mode activation unit 46 for outputting a logic HIGH signal in response to a high voltage signal input from the high voltage input pin HV, an OR gate 42 for performing an OR operation on the signal input from the MSB address pin A24 and the signal output from the test mode activation unit 46, and a driver input unit 44 for receiving a chip selection signal output from the OR gate 42.

The selection of the chips, Chip1 and Chip2, is controlled by the MSP address pin A24 and the high voltage pin HV. For example, when only the first chip Chip1 should be tested, a logic LOW signal is input to the MSB address pin A24. No signal is input to the high voltage input pin HV, causing the LOW level signal to be input to the OR gate 41 of the first chip Chip1 and the OR gate 42 of the second chip Chip2. As a result, a chip selection signal having a logic LOW level is output from both OR gates 41 to 42, and only the first chip Chip1 is enabled. When only the second chip Chip2 should be tested, a logic HIGH level signal is input to the MSB address pin A24, and no signal is input to the high voltage input pin HV, so that only the second chip Chip2 is enabled.

When both the first and the second chips Chip1 and Chip2 should be simultaneously selected, a logic LOW level signal is input to the MSB address pin A24. A high voltage input signal is input to the high voltage input pin HV, causing a logic LOW signal to be output from the test mode activation unit 45 and input to the OR gate 41 of the first chip Chip1 and a logic HIGH signal to be output from the test mode activation unit 46 and input to the OR gate 42. As a result, a logic LOW level is output from the OR gate 41, enabling the first chip Chip1. The logic HIGH level input to the OR gate 42 causes the output of the OR gate 42 to be a logic HIGH level, enabling the second chip Chip2. As a result, both the first and the second chips Chip1 and Chip2 can be simultaneously activated to be tested.

In a further embodiment, if the test mode activation unit 45 of the first chip Chip1 and the test mode activation unit 46 of the second chip Chip2 are designed in the same fashion, a fuse may be provided between the test mode activation units, 45 and 46, and the respective OR gates, 41 and 42, in each chip. In one example, the fuse between the test mode activation unit 45 and the OR operation unit 41 in the first chip Chip1 may be cut off. In operation, when a high voltage is applied to the a high voltage input pin, the logic HIGH signal is output from both the test mode activation units 45 and 46, but is not input to the OR operation unit 41 of the first chip Chip1 because of the cut fuse. Because Chip1 is to be enabled in response to the chip selection signal of a logic LOW level at the driver input unit 43, Chip2, or Chip1 and Chip2 may be selected depending on the signal on the MSB address pin A24. In such a way, each chip may be independently or simultaneously selected in a test.

According to embodiments, it is possible to provide a multi-chip package in which several chips that can be simultaneously selected for a test, thereby reducing the time required for the test. Although embodiments and examples above have been described in reference to two chips of a 512 Mbyte MCP, one of ordinary skill in the art will appreciate that embodiments may be extended to MCPs containing more than two chips, different sized memory chips and the types of chips.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multi-chip package comprising:
   a plurality of chips;
   a selection signal port configured to receive a selection signal to select one of the plurality of chips; and
   at least one dummy input signal port configured to receive at least one dummy input signal to select at least two chips in response to the at least one dummy input signal and the selection signal;
   wherein:
     the selection signal port is coupled to each of the chips such that each of the chips can receive the selection signal;
     the at least one dummy input signal port is coupled to each of chips separately from the selection signal port such that each of the chips can receive the at least one dummy input signal; and
     each chip is configured to be selected based on a logic operation on the received selection signal and the received dummy input signal.

2. The multi-chip package according to claim 1, wherein each of the chips comprises:
   a selection signal input terminal coupled to the selection signal port and configured to receive the selection signal;
   a dummy input terminal coupled to the at least one dummy input signal port and configured to receive one of the at least one dummy input signal; and
   an OR gate coupled to the selection signal input terminal and the dummy input terminal, configured to perform an OR operation on a signal input to the selection signal input terminal and a signal input to the dummy input terminal, and configured to output a chip selection signal for the chip.

3. The multi-chip package according to claim 2, comprising:
   a first chip of the chips configured to enable when a signal of the selection signal has a first voltage level; and
   a second chip of the chips configured to enable when the signal of the selection signal has a second voltage level different from the first voltage level.

4. The multi-chip package according to claim 2, wherein:
   the at least one dummy input signal comprises a plurality of dummy input signals;
   the dummy input terminal of each chip is coupled to the at least one dummy input signal port such that each chip is configured to receive one of the plurality of dummy input signals, and no one chip is configured to receive the same dummy input signal as any of the other chips.

5. The multi-chip package according to claim 1, wherein the chips are configured such that at least two chips are selected during a test mode in response to the at least one dummy input signal.

6. A multi-chip package comprising:
   a plurality of memory chips, each memory chip having a memory chip selection unit;
   at least one selection signal port to receive at least one selection signal, the memory chip selection unit of each memory chip to receive some or all of the at least one selection signal, and one or more of the plurality of memory chips to be selected in response to the at least one selection signal;
   wherein:
     the at least one selection signal comprises at least one address signal and at least one first signal;
     the at least one first signal is irrelevant to an address operation of the multi-chip package; and
     the memory chip selection unit of each memory chip is configured to perform a logic operation on the at least one address signal and the at least one first signal, and configured to control the selection of the corresponding memory chip based on the logic operation.

7. The multi-chip package of claim 6 wherein the at least one first signal corresponds to at least one dummy input signal.

8. The multi-chip package of claim 7 wherein:
   the at least one dummy input signal includes a plurality of dummy input signals;
   the memory chip selection unit of each memory chip is configured to receive one of the plurality of dummy input signals such that at least one of the plurality of dummy input signals is not to be received by more than one memory chip selection unit.

9. The multi-chip package of claim 7 wherein each memory chip selection unit comprises an OR gate configured to perform an OR operation on the at least one address signal and the at least one dummy input signal.

10. The multi-chip package of claim 6 wherein the at least one first signal comprises at least one instruction set signal.

11. The multi-chip package of claim 10 wherein the at least two of the plurality of memory chips are configured to be selected in response to a predetermined instruction set on the at least one instruction set signal, the predetermined instruction set associated with the selected memory chips.

12. The multi-chip package of claim 6 wherein the at least one first signal comprises:
   at least one high voltage signal.

13. The multi-chip package of claim 12 wherein each memory chip selection unit comprises an OR gate configured to perform an OR operation on the at least one address signal and the at least one high voltage signal.

14. The multi-chip package of claim 6 wherein at least two of the plurality of chips are configured to be selected substantially simultaneously in response to the same at least one selection signal in a test mode.

15. The multi-chip package according to claim 6, wherein the memory chips are configured such that at least two chips are selected during a test mode in response to the at least one first signal.

* * * * *